(12) United States Patent
Ji et al.

(10) Patent No.: US 11,378,586 B2
(45) Date of Patent: Jul. 5, 2022

(54) STIFFENER HAVING AN ELASTIC PORTION

(71) Applicant: Samsung Electronics Co., Ltd., Suwon-si (KR)

(72) Inventors: Joonsu Ji, Hwaseong-si (KR); Jinwoo Jung, Hwaseong-si (KR); Gyuyeol Kim, Hwaseong-si (KR); Jaehyoung Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 281 days.

(21) Appl. No.: 16/778,400

(22) Filed: Jan. 31, 2020

(65) Prior Publication Data

US 2021/0041479 A1 Feb. 11, 2021

(30) Foreign Application Priority Data

Aug. 5, 2019 (KR) .................. 10-2019-0094992

(51) Int. Cl.
*G01R 31/28* (2006.01)
*G01R 1/04* (2006.01)
*H01R 12/85* (2011.01)

(52) U.S. Cl.
CPC ....... *G01R 1/0408* (2013.01); *G01R 31/2831* (2013.01); *H01R 12/85* (2013.01); *H01R 2201/20* (2013.01)

(58) Field of Classification Search
CPC ............ G01R 1/07307; G01R 1/07342; G01R 1/0466; G01R 1/07314; G01R 31/2879; G01R 31/2886; G01R 31/2889; G01R 31/2896

See application file for complete search history.

(56) References Cited

U.S. PATENT DOCUMENTS

| | | |
|---|---|---|
| 6,642,729 B2 | 11/2003 | Kang et al. |
| 7,071,715 B2 | 7/2006 | Shinde et al. |
| 7,307,433 B2 | 12/2007 | Miller et al. |
| 7,772,858 B2 | 8/2010 | Sasaki et al. |
| 7,825,674 B2 | 11/2010 | Shinde et al. |
| 8,159,251 B2 | 4/2012 | Sasaki et al. |

(Continued)

FOREIGN PATENT DOCUMENTS

| | | |
|---|---|---|
| KR | 10-2002-0096094 A | 12/2002 |
| KR | 10-0950790 B1 | 4/2010 |

(Continued)

*Primary Examiner* — Tung X Nguyen
(74) *Attorney, Agent, or Firm* — Harness, Dickey & Pierce, P.L.C.

(57) ABSTRACT

A stiffener includes a first upper cover and a second upper cover, a first lateral side cover and a second lateral side cover, and a first longitudinal side cover and a second longitudinal side cover. The first and second upper covers extend in parallel with each other. The first and second lateral side covers are connected to separate, respective covers of the first and second upper covers, and facing each other. The first and second longitudinal side covers are each connected to the both first and second upper covers, the first and second longitudinal side covers facing each other. The first and second upper covers each include a separate plurality of upper elastic portions. Each upper elastic portion of each separate plurality of upper elastic portions has a vertical elasticity.

20 Claims, 14 Drawing Sheets

(56) References Cited

U.S. PATENT DOCUMENTS

| | | | |
|---|---|---|---|
| 8,604,814 B2 | 12/2013 | Kim | |
| 2006/0255814 A1* | 11/2006 | Eldridge | G01R 31/2863 |
| | | | 324/750.03 |
| 2008/0290884 A1 | 11/2008 | Lin | |
| 2010/0053601 A1 | 3/2010 | Osawa et al. | |
| 2010/0134129 A1* | 6/2010 | Breinlinger | G01R 31/2874 |
| | | | 324/750.28 |
| 2010/0225345 A1 | 9/2010 | Kim et al. | |

FOREIGN PATENT DOCUMENTS

| | | |
|---|---|---|
| KR | 10-1033454 B1 | 5/2011 |
| KR | 10-2012-0061378 A | 6/2012 |
| KR | 10-1605807 B1 | 3/2016 |

* cited by examiner

STIFFENER HAVING AN ELASTIC PORTION

CROSS-REFERENCE TO RELATED APPLICATION

This application claims the benefit of priority, under 35 U.S.C. § 119, from Korean Patent Application No. 10-2019-0094992, filed on Aug. 5, 2019, the disclosure of which is incorporated herein by reference in its entirety.

BACKGROUND

1. Field

The present disclosure relates to a stiffener having elastic portions and a stiffener handling tool for handling the stiffener, and particularly when combining a male ZIF (Zero Insertion Force) of a probe card with a female ZIF of a test board, the stiffener used as a ZIF immobilizing device for removing a play between the male ZIF and the female ZIF and fixing them, and a handling tool for combining and separating the stiffener with the probe card.

2. Description of Related Art

Wafer-level semiconductor chips are tested in a test apparatus using the probe card. The test apparatus tests wafer-level semiconductor chips using test boards electrically connected to the probe cards. The female ZIF on a test board and a male ZIF on a probe card each combine to form an electrical connection such that the test board is electrically connected to the probe card. In the test, a wafer chuck moves up to form a physical contact and an electrical connection between a plurality of probing pins of a DUT (device under test) layer of the probe card and a plurality of pads on a wafer on the wafer chuck, thereby inducing an upwards force. The upwards force induced by each single probing pin of the DUT layer of the probe card is minimal, but the combined upwards force induced by more than hundreds of thousands to millions of probing pins is not insignificant. This combined upwards force can cause bending, leaning (tilting), or other physical deformation of the probe card, which may result in uneven spacing between the female ZIF and the male ZIF, and physical bonds between the female ZIF and the male ZIF may become unstable.

SUMMARY

Some example embodiments of the present disclosure provide an immobilizing device configured to remove the play between the female ZIF of the test board and the male ZIF of the probe card and fixing them.

Some example embodiments of the present disclosure provide tools for handling the immobilizing device.

Some example embodiments of the disclosure provide a stiffener that includes a first upper cover and a second upper cover, a first lateral side cover and a second lateral side cover, and a first longitudinal side cover and a second longitudinal side cover. The first and second upper covers may extend in parallel with each other. The first and second lateral side covers may be connected to separate, respective covers of the first and second upper covers, and facing each other. The first and second longitudinal side covers may be each connected to the both first and second upper covers, the first and second longitudinal side covers facing each other. The first and second upper covers may each include a separate plurality of upper elastic portions. Each upper elastic portion of each separate plurality of upper elastic portions may have a vertical elasticity.

Some example embodiments of the disclosure provide a stiffener that includes a plurality of upper covers configured to cover an upper surface of a base portion of a male Zero Insertion Force (ZIF) and a plurality of lateral side covers configured to cover separate, respective lateral sides of the base portion of the male ZIF. The plurality of upper covers may each include a separate plurality of upper elastic portions having a vertical elasticity.

Some example embodiments of the disclosure provide a test apparatus that includes a main tester processing circuitry, a wafer prober, and a cable electrically connecting the main tester processing circuitry and the wafer prober. The wafer prober may include a test head including a test board and a female Zero Insertion Force (ZIF) and a test stage having a wafer chuck configured to hold a wafer and a supporter configured to structurally support a probe card. The female ZIF of the test head and a male ZIF of the probe card may be configured to be engaged to each other using a stiffener interposed therebetween. The stiffener may include a plurality of upper elastic portions having a vertical elasticity.

Some example embodiments of the disclosure provide a stiffener handling tool including a handle structure having a holding socket, and a plurality of guide dams at least partially defining the holding socket.

Some example embodiments of the disclosure provide a stiffener handling tool including a handle structure having a holding socket, a plurality of guide dams at least partially defining the holding socket, and a plurality of magnets embedded in the handle structure, one end of each magnet of the plurality of magnets being exposed in the holding socket. The holding socket may include an upper holding socket and a lower holding socket, a width of the upper holding socket is smaller than a width of the lower holding socket, and a depth of the lower holding socket is smaller than a depth of the upper holding socket.

Some example embodiments of the disclosure provide a stiffener handing tool including a handle structure having a holding socket, a plurality of guide dams at least partially defining the holding socket, and a push actuator extending through the handle structure to the holding socket.

DETAILED DESCRIPTION

Figure 1:
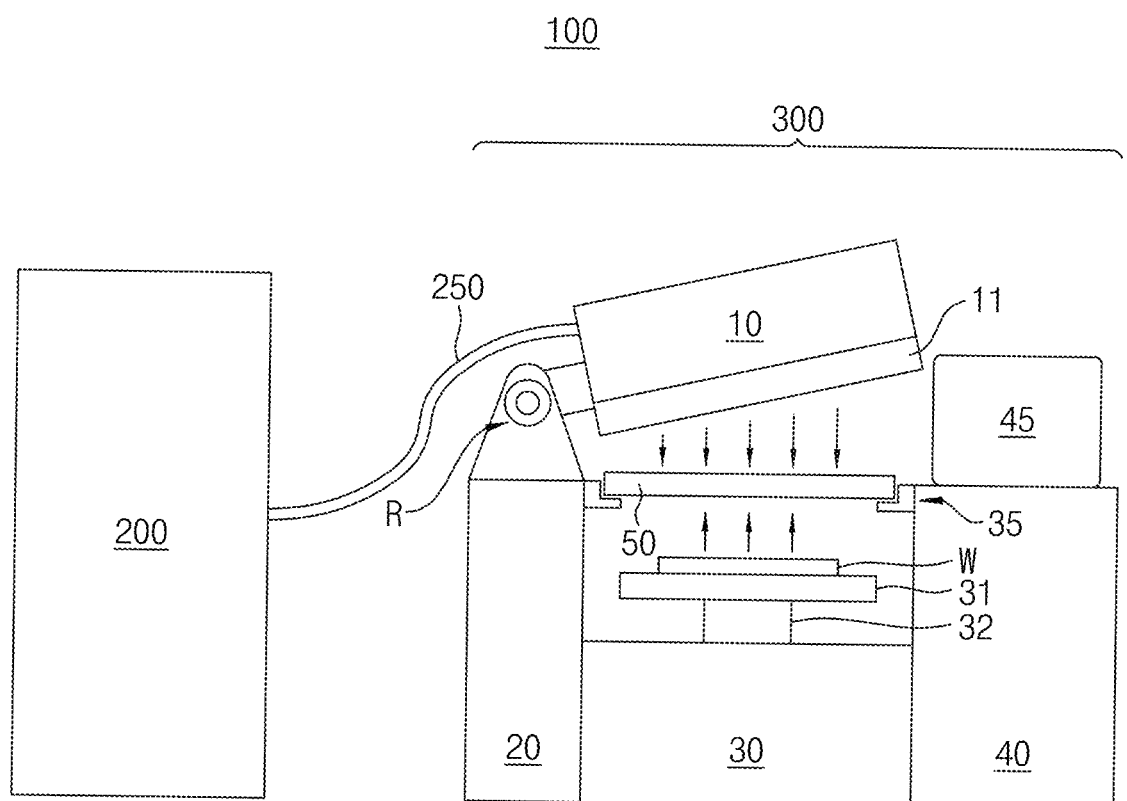
FIG. 1 is a side view schematically illustrating a test apparatus according to some example embodiments of the present disclosure.

FIG. 1 is a side view schematically illustrating a test apparatus 100 according to some example embodiments of the present disclosure.

Referring to FIG. 1, a test apparatus 100 according to some example embodiments of the present disclosure may include a main tester 200, a wafer prober 300, and a cable 250. The cable 250 may electrically connect the main tester 200 to the wafer prober 300.

The main tester 200 may generate input test signals for testing the electrical characteristics of semiconductor chips of a wafer W and transmit the signals to the wafer prober 300 through the cable 250, and may receive output test signals according to a wafer test result from the wafer prober 300 through the cable 250. The main tester 200 may analyze the received output test signals to determine the performance of the chips of the wafer W.

The main tester 200 may be included in, may include, and/or may be implemented by, one or more instances of processing circuitry (also referred to herein interchangeably as integrated circuitry) such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of the main tester 200. Accordingly, in some example embodiments, a main tester 200 that includes, is included in, and/or is at least partially implemented by one or more instances of processing circuitry may be referred to herein interchangeably as a main tester processing circuitry.

The wafer prober 300 may include a test head 11 on which a test board 10 is mounted, a head manipulator 20, a test stage 30, and a wafer handling part 40.

The test head 11 may receive the input test signals for testing the wafer W from the main tester 200 through the cable 250, and transfer the output test signals based on the test result through the cable 250 to the main tester 200. The test head 11 may have a test circuit embedded therein and may include slots for inserting a plurality of test cards.

The head manipulator 20 may be mechanically connected to the test head 11. The head manipulator 20 may include an actuator that may move the test head 11 by swinging operation. For example, the test head 11 may be mechanically connected to the rotation shaft R of the head manipulator 20 and move up and down by rotation and swing operation of the rotation shaft R. Thus, the test board 10 of the test head 11 may be in contact with a probe card 50 by the moving down operation by the swing and may be electrically connected.

The test stage 30 may include a wafer chuck 31, a chuck driver 32, and a rim supporter 35. The wafer W to be tested may be mounted on the wafer chuck 31, such that the wafer chuck may hold the wafer W. The wafer chuck 31 may be configured to move horizontally, vertically, and rotate by the chuck driver 32. For example, the wafer chuck 31 can move horizontally in a forward-backward direction and the left-right direction, and can move vertically in the up-down direction. As the wafer chuck 31 is moved up by the chuck driver 32, the wafer W and the probe card 50 may be electrically connected to each other. In some example embodiments, the wafer chuck 31 can rotate. For example, the wafer chuck 31 can align the probe card 50 and the wafer W by a rotating operation. The rim supporter 35 may structurally support (e.g., support a weight of) the probe card 50. The rim supporter 35 may contact a brim of the probe card 50 to structurally support the probe card 50.

The wafer handling part 40 may have a cassette stock 45. For example, cassettes for shipping the wafer (W) may be mounted on the cassette stock 45. The wafer handling part 40 may transfer the wafer W between the cassette stock 45 and the wafer chuck 31. For example, after the wafer chuck 31 moves to the wafer handling part 40, the wafer W may be transferred between the cassette stock 45 and the wafer chuck 31 to be mounted on the wafer chuck 31.

Figure 2A:
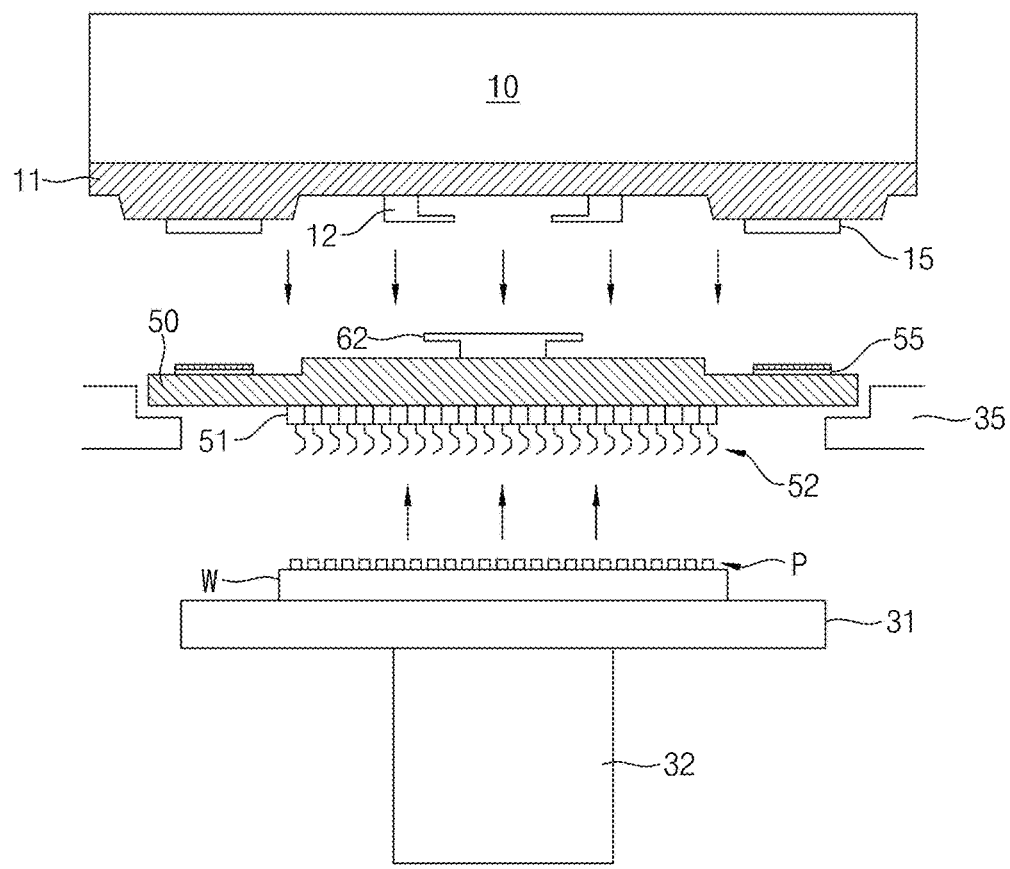
FIGS. 2A and 2B illustrate a test head of a wafer prober, a probe card, and a wafer on a wafer chuck contacting each other to form an electrical connection according to some example embodiments of the present disclosure.
Figure 2B:
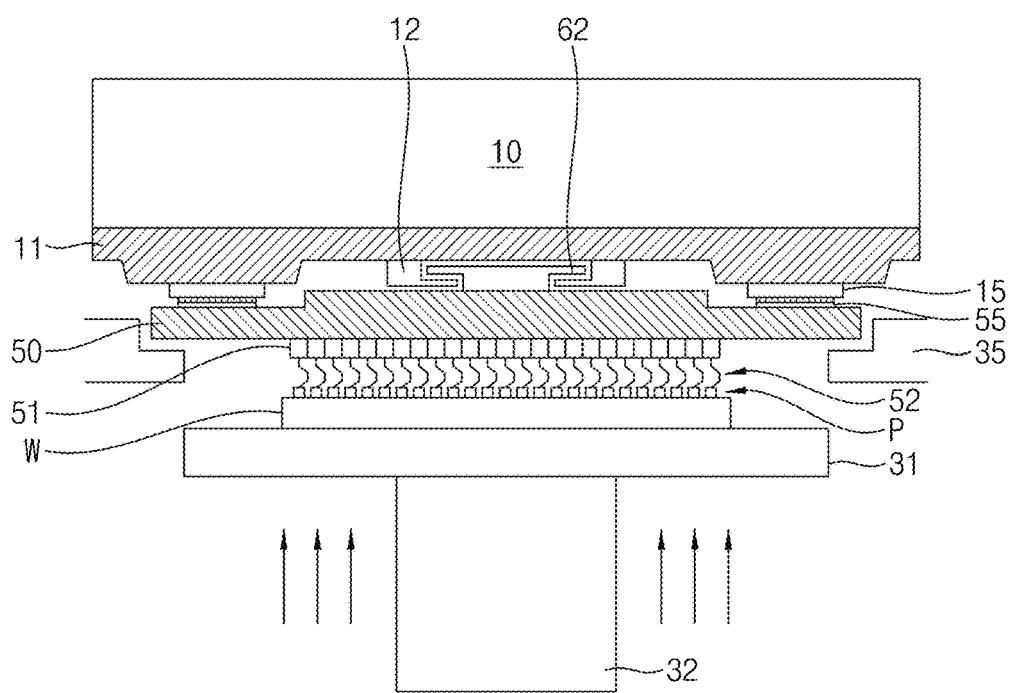

FIGS. 2A and 2B illustrate the test head 11 of the wafer prober 300, the probe card 50, and the wafer W on the wafer chuck 31 contacting each other to form an electrical connection.

Referring to FIGS. 2A and 2B, as the test head 11 on which the test board 10 is mounted moves down to the probe card 50 by the swing operation of the head manipulator 20, and the wafer chuck 31 in which the wafer W is mounted moves up to the probe card 50, the test board 10, the probe card 50, and the wafer W may be electrically connected to each other. A card clamper 12 of the test head 11 and a flange portion 62 of the probe card 50 may be mechanically combined by rotation of the test head 11.

A female ZIF 15 at a lower portion of the test board 10 and a male ZIF 55 at an upper portion of the probe card 50 may be mechanically combined to form an electrical connection. For example, after a part of the male ZIF 55 of the probe card 50 is inserted into the female ZIF 15 of the test head 11, the female ZIF 15 can be tightened, whereby the electrical connection may be formed between the male ZIF 55 of the probe card 50 and the female ZIF 15 of the test board 10.

As the wafer chuck 31 moves up, a plurality of pads P of the wafer W mounted on the wafer chuck 31 and a plurality of probing pins 52 of the DUT layer 51 of the probe card 50 may be in contact with each other to make electrical connections. The probing pins 52 may include a metal having elasticity. In the process, the probing pins 52 may receive a moving up force by the pads P of the moving up wafer W. The moving up force received by one of the probing pins 52 is very low, but the number of DUTs of the DUT layer 51 of one probe card 50 is more than approximately hundreds to thousands, and a plurality of probing pins of one DUT are also approximately hundreds or more, the total moving up force that the probe card 50 receives may be very high. By the total moving up force, the probe card 50 may be bent or tilted. In the present disclosure, the total moving up force affecting a central area of the probe card 50 may be buffered and supplemented by the combination of the card clamper 12 and the flange portion 62, and the total moving up force affecting peripheral areas of the probe card 50 may be buffered and supplemented by stiffeners (See 60 in FIG. 3A) between the female ZIFs 15 and the male ZIFs 55.

Figure 3A:
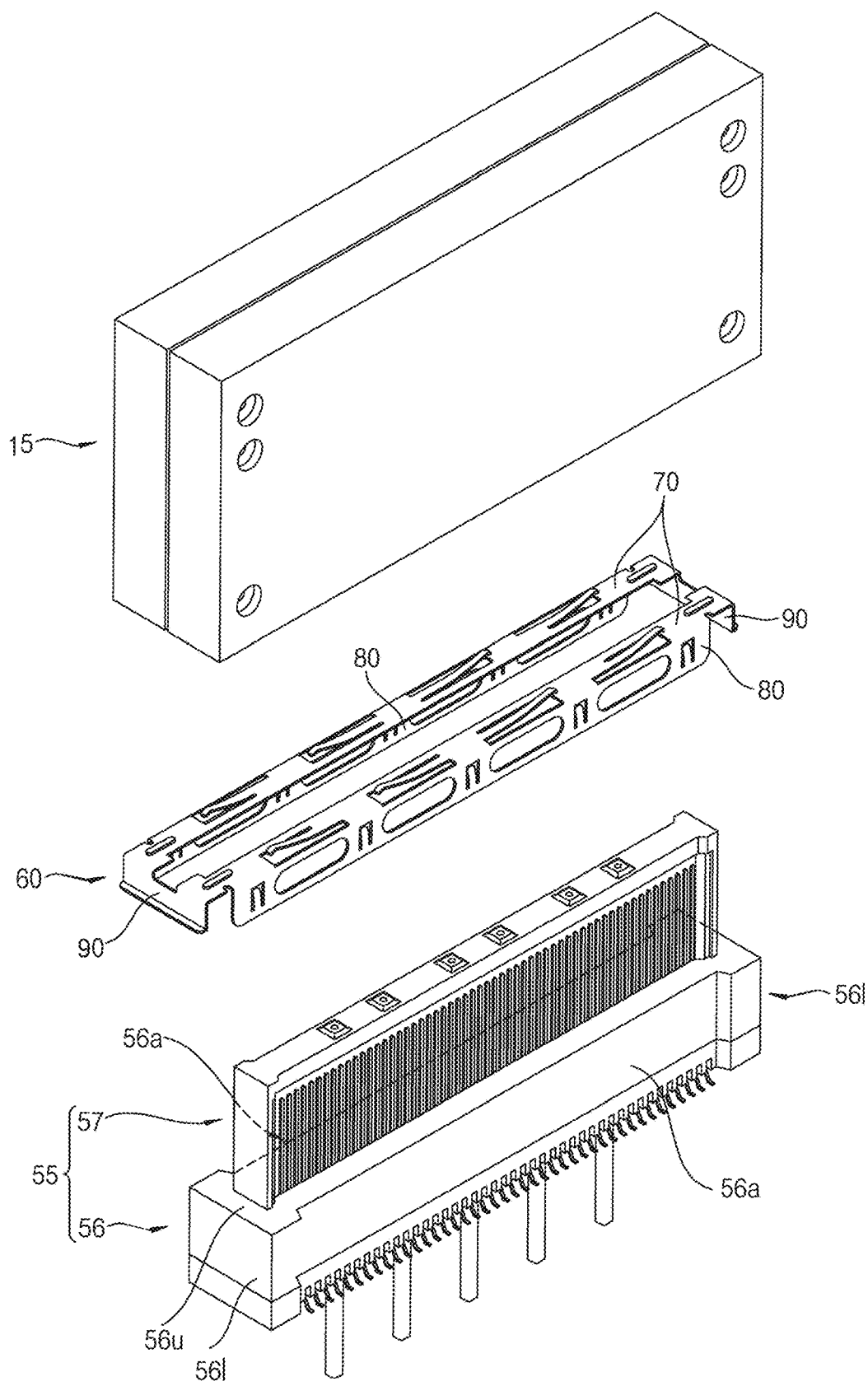
FIGS. 3A and 3B illustrate an engagement of a female ZIF, a stiffener 60, and the male ZIF 55 according to some example embodiments of the present disclosure.
Figure 3B:
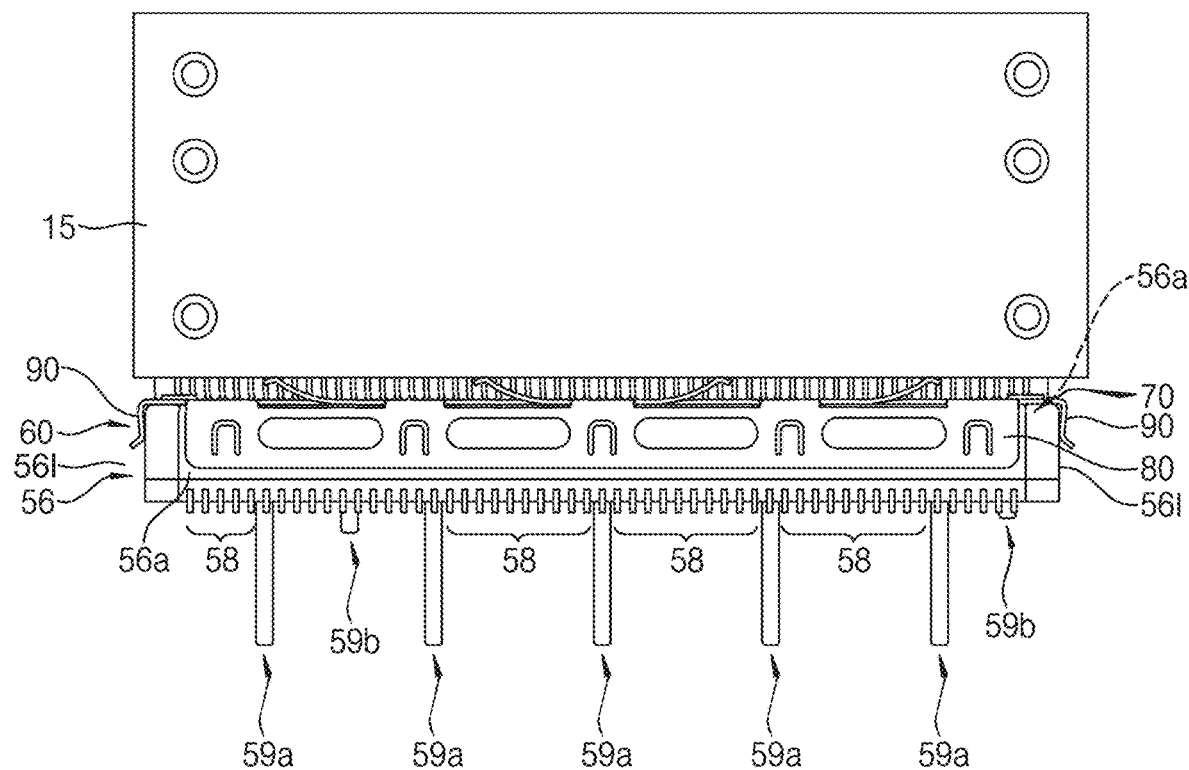

FIGS. 3A and 3B illustrate an engagement of the female ZIF 15, a stiffener 60, and the male ZIF 55 according to some example embodiments of the present disclosure. As shown, the female ZIF 15 and the male ZIF 55 may be configured to be engaged to each other using the stiffener 60 interposed therebetween.

Figure 4A:
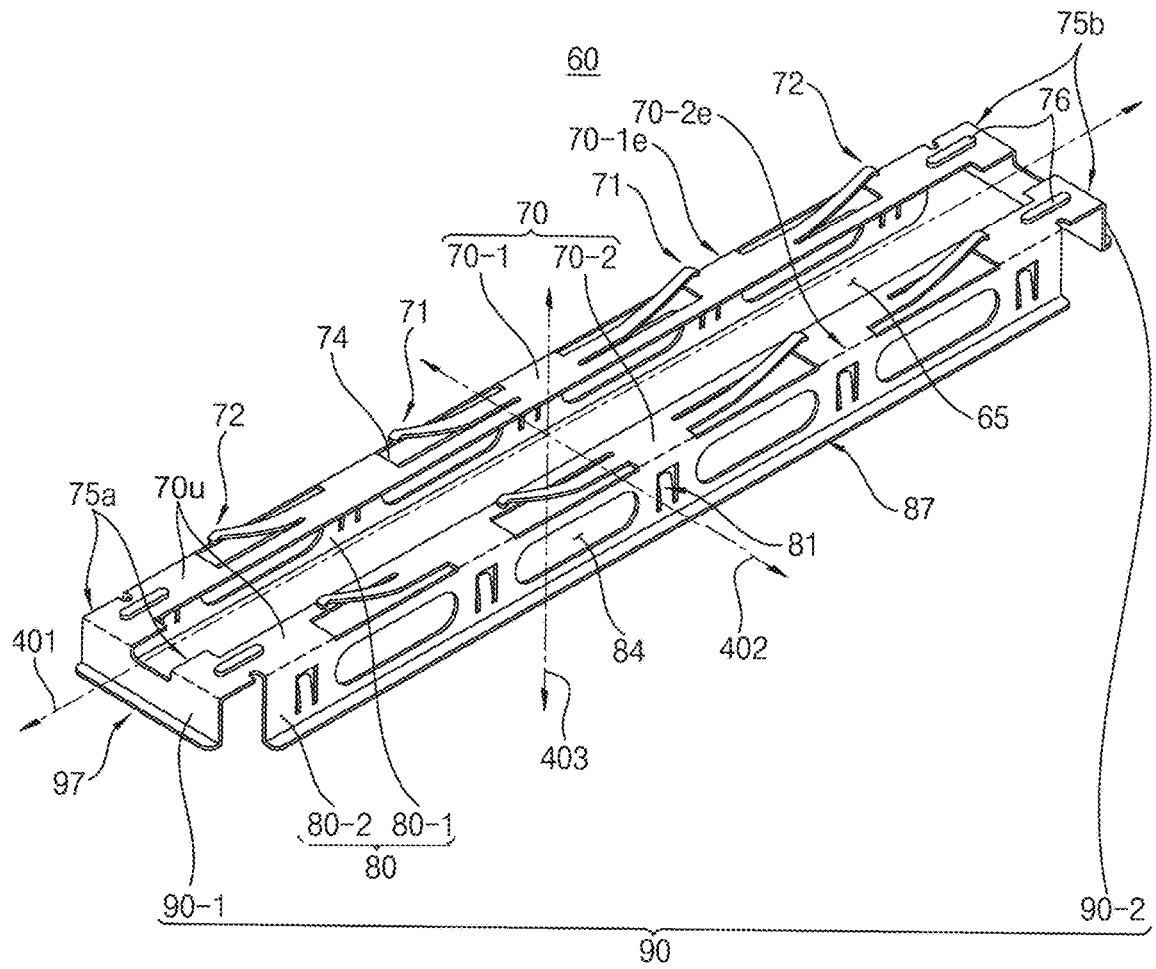
FIGS. 4A, 4B, 4C, 4D, and 4E are a perspective view, a top view, a front view, a side view, and a side cross-sectional view showing the stiffener according to some example embodiments of the present disclosure.

Referring to FIGS. 3A and 3B, a protruding connector portion 57 of the male ZIF 55 may be inserted into the female ZIF 15 through an insert hole 65 (Shown in FIGS. 4A and 4B) of the stiffener 60. For example, the female ZIF 15 may have a plurality of socket type connection terminals. The socket type connection terminals may be in physically contact with the connector portion 57 of the male ZIF 55 and may be electrically connected. The stiffener 60 may be interposed between the female ZIF 15 and a base portion 56 of the male ZIF 55. The female ZIF 15 tightens the connector portion 57 of the male ZIF 55 inserted in the female ZIF 15 from both sides, so that, the physical contact and electrical connection between the female ZIF 15 and the male ZIF 55 can be strengthened. The male ZIF 55 may include a plurality of lower terminals 58, fixing rods 59a, and guide pegs 59b below the base portion 56, and the plurality of upper terminals both sides of the connector portion 57. The lower terminals 58 may be disposed at/on two sides of the base portion 56 of the male ZIF 55 to protrude downwardly. The lower terminals 58 may be electrically connected to the probe card 50. The fixing rods 59a may be mechanically combine to the probe card 50 to fix the male ZIF 55 on the probe card 50. For example, the fixing rods 59a may include rivets or bolts. The guide peg 59b may be used as an alignment key so that when the male ZIF 55 is combined with the probe card 50, the left and right or front and rear sides can be properly aligned without being changed.

FIGS. 4A, 4B, 4C, 4D, and 4E are a perspective view, a top view, a front view, a side view, and a side cross-sectional view showing the stiffener 60 according to some example embodiments of the present disclosure.

Referring to FIG. 4A to 4D, the stiffener 60 according to some example embodiments of the present disclosure includes upper covers 70, lateral side covers 80 connected to lateral side ends of the upper covers 70, and longitudinal side covers 90 connected with longitudinal side ends of the upper covers 70. As shown in at least FIGS. 4A-4C and 4E, a first lateral side cover 80-1 may be connected (e.g., directly connected) with a first lateral side end 70-1e of a first upper cover 70-1, a second lateral side cover 80-2 may be connected (e.g., directly connected) with a second lateral side end 70-2e of a second upper cover 70-2, a first longitudinal side cover 90-1 may be connected (e.g., directly connected) with a first longitudinal side end 75a of both the first upper cover 70-1 and the second upper cover 70-2, and the second longitudinal side cover 90-2 may be connected (e.g., directly connected) with a second longitudinal side end 75b of both the first upper cover 70-1 and the second upper cover 70-2. In some example embodiments, the stiffener 60 may have a shell shape or a cover shape that partially covers the base portion 56 of the male ZIF 55. As shown in at least FIG. 3B, the upper covers 70 may cover an upper surface 56u of the base portion 56 of the male ZIF 55, and the lateral side covers 80 may cover separate, respective lateral side ends 56a of the base portion 56 of the male ZIF 55, and the longitudinal side covers 90 may cover separate, respective longitudinal side ends 561 of the base portion 56 of the male ZIF 55.

As shown in at least FIGS. 4A-4B and 4D-4E, the upper covers 70 may include two boards or panels parallel to each other in a form of a rail. Said two boards of the upper covers 70 may be referred to as the first upper cover 70-1 and the second upper cover 70-2. As shown in FIGS. 4A-4B and 4D-4E, the first and second upper covers 70-1 and 70-2 may extend in parallel with each other, for example such that upper surfaces 70-1u and 70-2u of the first and second upper covers 70-1 and 70-2 are coplanar with each other. The upper covers 70 may include a plurality of upper elastic portions 71 and 72 (also referred to herein as upper elastic projection structures), respectively. The upper elastic portions 71 and 72 may include first upper elastic portions 71 and second upper elastic portions 72. For example, when each upper cover 70 includes four upper elastic portions 71 and 72, two first upper elastic portions 71 disposed closer to a center and two second upper elastic portions 72 disposed closer to the longitudinal ends of the upper cover 70. In some example embodiments, the first upper elastic portions 71 may be disposed closer to the longitudinal ends of the upper cover 70, and the second upper elastic portions 72 may be disposed closer to the center of the upper covers 70. In some example embodiments, the first upper elastic portions 71 and the second upper elastic portions 72 may be alternately disposed. In some example embodiments, the upper covers 70 each have more upper elastics than shown in FIG. 4A. The upper elastic portions 71 and 72 of each upper cover 70 of the first and second upper covers 70-1 and 70-2 may include at least one panel type spring (e.g., a flat spring) having elasticity against pressure from the upward direction (referred to herein as vertical elasticity). For example, the upper elastic portions 71 and 72 may have elasticity in the vertical direction (e.g., vertical elasticity). Restated, each upper elastic portion 71 and/or 72 of each separate plurality of upper elastic portions 71 and 72 of each upper cover 70 of the first and second upper covers 70-1 and 70-2 may have a vertical elasticity, where the respective vertical elasticities of the upper elastic portions 71 and 72 may be the same or different from each other (e.g., the upper elastic portions 71 may have a first vertical elasticity and the upper elastic portions 72 may have a second vertical elasticity that is different from (e.g., greater than) the first vertical elasticity) In some example embodiments, the upper elastic portions 71 and 72 may each include first ends (or root portions) connected with the upper covers 70, and protruding second ends (head portions). The uppermost of the second ends may be bent downward so that the uppermost portions of the upper elastic portions 71 and 72 are curved. For example, the uppermost portions of the upper elastic portions 71 and 72 may be rounded.

Figure 4B:
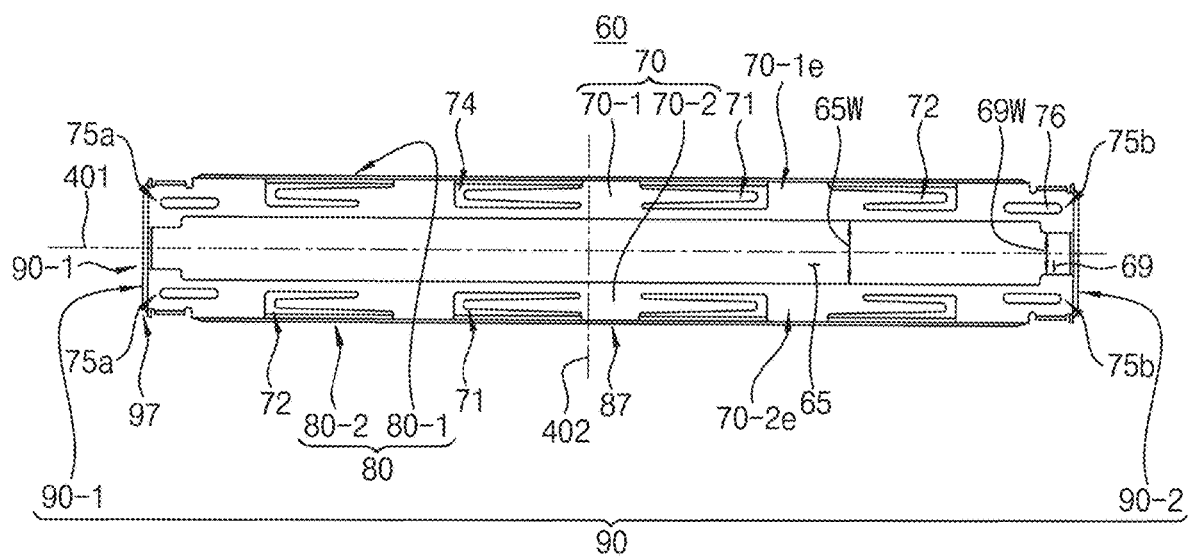
Figure 4C:
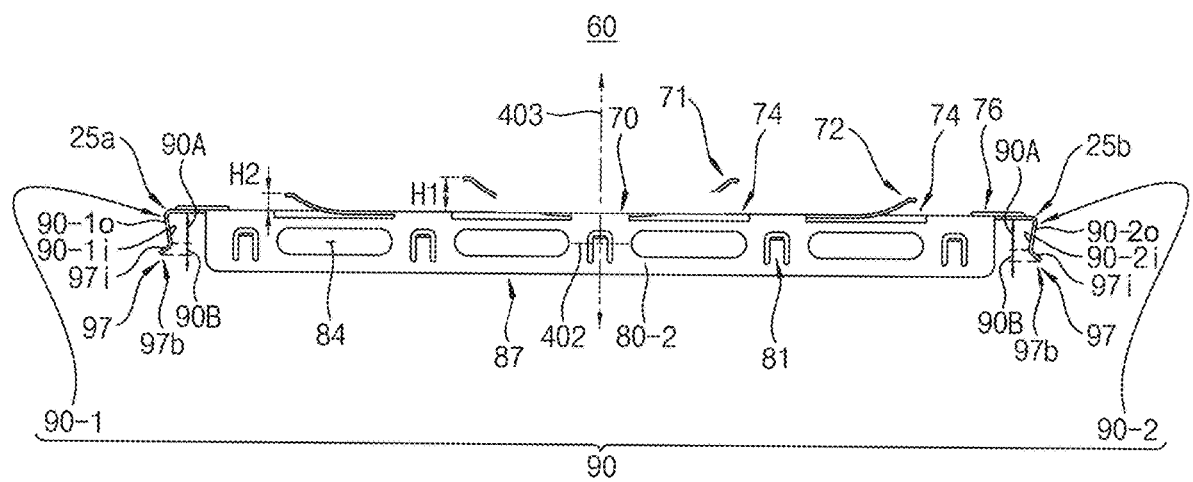
Figure 4D:
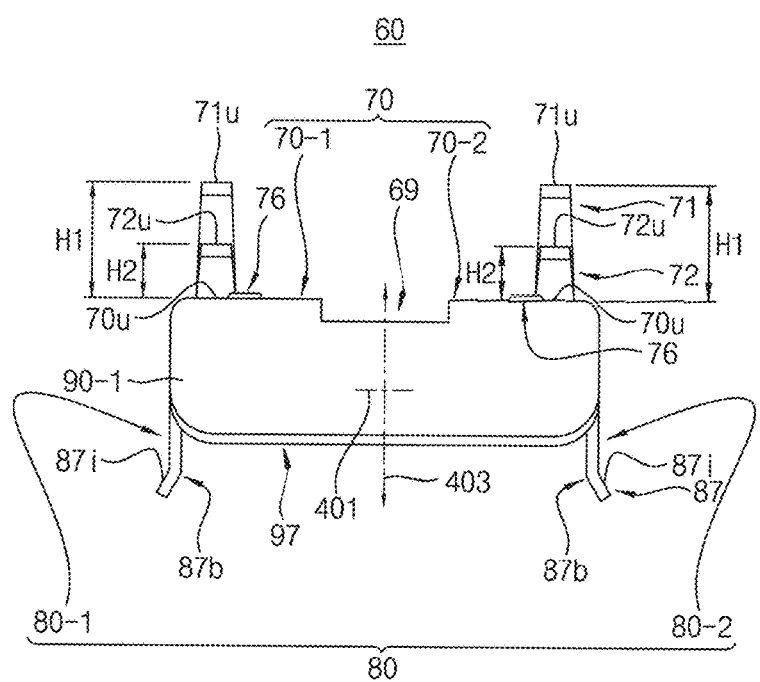

The first upper elastic portions 71 may have a height higher than that of the second upper elastic portions 72. (H1>H2) For example, the first upper elastic portions 71 may have a first vertical height H1 of about 2.2 mm (±10%), and the second upper elastic portions 72 may have a second height of about 1.2 mm (±20%) The H1 may be a height from the surface of the upper cover 70 or the center of the upper cover 70 to the uppermost portion of the first upper elastic portion 71, and the H2 may be a height from the top or center of the upper cover 70 to the uppermost portion of the first upper elastic portion 71. As shown in FIG. 4D, for example, a height from a top surface 70U of one upper cover 70, of the first upper cover 70-1 or the second upper cover 70-2, to an uppermost surface 71U of a first upper elastic portion 71 of the separate plurality of upper elastic portions of the one upper cover 70 is a first height H1, a height from the top surface 70U of the one upper cover 70 to an uppermost surface 72U of a second upper elastic portion 72 of the separate plurality of upper elastic portions of the one upper cover 70 is a second height H2, and the first height H1 is greater than the second height H2. The illustrated numerical values are numerical values according to some example embodiments, but are not limited thereto.

Thus, the first upper elastic portions 71 may first counter the pressure from the upper direction than the second upper elastic portions 72, may be more flexible, and may have a stronger elastic force (e.g., a greater vertical elasticity). The first upper elastic portions 71 may have a relatively large elastic range (variable width), and the second upper elastic portions 72 may have a relatively small elastic range (variable width). Restated, the first upper elastic portions 71 may have a first elastic range and the second upper elastic portions 72 may have a second elastic range, where the second elastic range is smaller than the first elastic range.

In some example embodiments, the second upper elastic portions 72 may be smaller and/or shorter than the first upper elastic portions 71. For example, the second upper elastic portions 72 may have less flexibility and less elasticity (e.g., smaller vertical elasticity), and a stronger supporting force than the first upper elastic portions 71. End portions of the first and second upper elastic portions 71 and 72 may be curved to slide on the lower surface of the female ZIF 15 without scratching. Referring FIGS. 4B and 4C, the first upper elastic portions 71 may be larger or longer than the second upper elastic portions 72. In some example embodiments, the positions, heights, elasticities, sizes, or shapes of the first upper elastic portions 71 and the second upper elastic portions 72 may be interchanged. In some example embodiments, the first upper elastic portions 71 and the second upper elastic portions 72 may have the same height, uniform elasticity, the same size, or the same shape.

The upper covers 70 may further include a plurality of upper windows 74 (e.g., holes extending through the respective upper covers 70) formed below the first and second upper elastic portions 71 and 72 of the respective upper covers 70. The upper windows 74 and the upper elastic portions 71 and 72 may be vertically aligned (e.g., aligned in a direction extending in parallel with the depth axis 403 of the stiffener 60). For example, in a top view, as shown in at least FIG. 4B, the upper elastic portions 71 and 72 and the upper windows 74 may each overlap. In another example, and as shown in at least FIG. 4A, where each upper cover 70 of the first and second upper covers 70-1 and 70-2 includes at least one upper window 74, the at least one upper window 74 may vertically overlap (e.g., overlap in a direction extending in parallel with the depth axis 403) with one upper elastic portion 71 or 72 of the separate plurality of upper elastic portions 71 and 72 of the respective upper cover 70.

The upper windows 74 may be spaces removed from the upper covers 70 to form the upper elastic portions 71 and 72. The upper windows 74 may improve the mechanical resilience, flexibility, and strength of upper covers 70, and may facilitate the manufacturing process.

The upper covers 70 may each further include embossing portions 76 located at both end regions. The embossing portions 76 may protrude upward from the top surface 70U of the upper covers 70. Restated, and as shown in at least FIGS. 4A and 4C-4D, each upper cover 70 of the first and second upper covers 70-1 and 70-2 may include a separate plurality of embossing portions 76 (also referred to as embossing structures) protruding upwardly (e.g., away) from a top surface 70U of the respective upper cover 70. The embossing portions 76 may have a bar shape or dots shapes in a top view (e.g., as shown in FIG. 4B), and may have a mesa shape in a side view (e.g., as shown in FIGS. 4C and 4D). The embossing portions 76 may be resistance portions that contact the lower surface of the female ZIF 15 when the first and second upper elastic portions 71 and 72 are compressed down. Thus, the embossing portions 76 may provide a final level at which the female ZIF 15 no longer moves down, and may physically protect the first and second upper elastic portions 72. In the top view, the embossing portions 76 may be aligned horizontally with the upper elastic portions 71, 72 and/or the upper windows 74. The upper covers 70 may have a thickness of about 0.2 mm (±20%), and the embossing portions 76 may have a protruding thickness of about 0.4 mm (±20%).

Figure 4E:
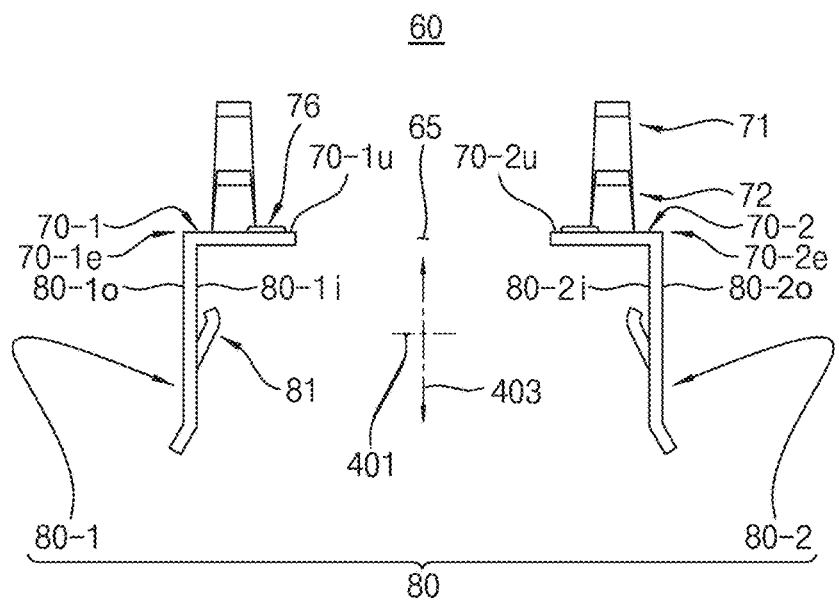

The lateral side covers 80 may be two panels shape that are parallel and facing each other. Said two panels of the lateral side covers 80 may be referred to as a first lateral side cover 80-1 and a second lateral side cover 80-2. As shown in FIGS. 4D-4E, the first and second lateral side covers 80-1 and 80-2 may be connected (e.g., directly connected) to separate, respective upper covers 70 of the first and second upper covers 70-1 and 70-2, and may extend in parallel with each other and may face each other, for example such that the outer surfaces 80-1$u$ and 80-2$u$ of the first and second lateral side covers 80-1 and 80-2 face outwards from each other (e.g., are opposite surfaces) and the inner surfaces 80-1$i$ and 80-2$i$ of the first and second lateral side covers 80-1 and 80-2 face inwards towards each other (e.g., are opposing surfaces). The lateral side covers 80 may each include at least one lateral side elastic portion 81. As shown in FIG. 4E, the lateral side elastic portions 81 may protrude into the lateral side covers 80 (e.g., towards the longitudinal axis 401 of the stiffener 60). For example, the lateral side elastic portions 81 may include a panel spring. The lateral side elastic portions 81 may provide physical and mechanical force such that the stiffener 60 is tightly coupled with the base portion 56 of the male ZIF 55. The lateral side covers 80 may each include at least one lateral side window 84. The lateral side windows 84 may improve the mechanical elasticity and strength of the lateral side covers 80, and cooling efficiency. The lateral side covers 80 may further include separate, respective lower lateral side bending portions 87. As shown in at least FIGS. 4D-4E, the lateral side bending portions 87 may each be bent 87$b$ outward from a longitudinal axis 401 of the stiffener 60 so as to have an inclined surface 87$i$. When the stiffener 60 is engaged with the male ZIF 55, the lateral side bending portions 87 may guide the side of the base portion 56 of the male ZIF 55, and improve the mechanical elasticity and strength of the lateral side covers 80. For example, the lateral side bending portions 87 may have a bending width (bending thickness or height) of about 0.8 mm (±20%).

The longitudinal side covers 90 may include two panels facing with each other. Said two panels of the longitudinal side covers 90 may be referred to as a first longitudinal side cover 90-1 and a second longitudinal side cover 90-2. As shown in FIGS. 4B-4C, the first and second longitudinal side covers 90-1 and 90-2 may each be connected (e.g., directly connected) to both upper covers 70 of the first and second upper covers 70-1 and 70-2, at opposite ends of the first and second upper covers 70-1 and 70-2, respectively, and may extend in parallel with each other and may face each other, for example such that the outer surfaces 90-1$u$ and 90-2$u$ of the first and second longitudinal side covers 90-1 and 90-2 face outwards from each other (e.g., are opposite surfaces) and the inner surfaces 90-1$i$ and 90-2$i$ of the first and second longitudinal side covers 90-1 and 90-2 face inwards towards each other (e.g., are opposing surfaces). The longitudinal side covers 90 may be in contact with the male ZIF 55 to support both longitudinal ends of the male ZIF 55. The longitudinal side covers 90-1 and 90-2 may include separate, respective longitudinal side bending portions 97. The longitudinal side bending portions 97 may also be each bent 97$b$ outward from a lateral axis 402 of the stiffener 60 so as to have an inclined surface 97$i$. The longitudinal side bending portions 97 may serve as a guide of the longitudinal side when the stiffener 60 is engaged with the male ZIF 55, and may improve the mechanical elasticity and strength of the longitudinal side covers 90. In addition, the longitudinal side bending portions 97 may absorb and relax a stress when the stiffener 60 is separated from the male ZIF 55. Referring to FIG. 4C, the longitudinal side covers 90 may have a bending shape (e.g., may each be bent) to be inclined in an overhang shape, such that the longitudinal side covers 90-1 and 90-2 each have an upper portion 90A that is inclined towards the lateral axis 402 with increasing distance away from the upper covers 70 to which the respective longitudinal side cover 90-1 or 90-2 is directly connected, and a lower portion 90B, integrally connected to a bottom of the upper portion 90A, that is inclined away from the lateral axis 402 with increasing distance from the upper covers 70 to which the respective longitudinal side cover 90-1 or 90-2 is directly connected. Restated, the upper portion 90A may be negatively bended (e.g., reverse incline), and the lower portion 90B may be positively bended with respect to the lateral axis 402. For example, the longitudinal side bending portions 97 may have a bending width (bending thickness or height) of about 0.8 mm (±20%).

Referring to FIG. 4D, the upper portions 90A of the longitudinal side covers 90 may further include cut-out portions 69 to assist in defining the insert hole 65 thereon. As shown in at least FIGS. 4A-4B, the first and second upper covers 70-1 and 70-2 may at least partially define the insert hole 65 between the first and second upper covers 70-1 and 70-2, such that the first and second upper covers 70-1 and 70-2 define a horizontal width 65 W of the insert hole 65 as a magnitude of a distance between the first and second upper covers 70-1 and 70-2 in a direction that is parallel with the lateral axis 402 of the stiffener 60. The cut-out portions 69 can widen both end regions of the insert hole 65 so that the connector portion 57 of the male ZIF 55 can be easily inserted into the insert hole 65. The cut-out portions 69 can also reduce a mechanical resistance so that the longitudinal side covers 90 can bend easily. The horizontal width 69 W of the cut-out portions 69 may be narrower (e.g., smaller) than the horizontal width 65 W of the insert hole 65.

The upper covers 70 and the longitudinal side covers 90 may have a frame shape defining the insert holes 65 in a top view.

The stiffener 60 may include a stainless metal such as steel type stainless (STS) or steel use stainless (SUS). In some example embodiments, stiffener 60 may comprise an elastic metal plated with a stainless metal.

During a test process, heat may be generated due to electrical flow. This thermal burden may affect the accuracy of the test, may also cause physical deformation of the connector portion 57 of the male ZIF 55. Therefore, the cooling ability of the stiffener 60 may be considered important.

FIGS. 5A, 5B, 5C, 5D, 5E, and 5F are schematic views illustrating stiffeners 60 according to some example embodiments of the present disclosure.

Figure 5A:
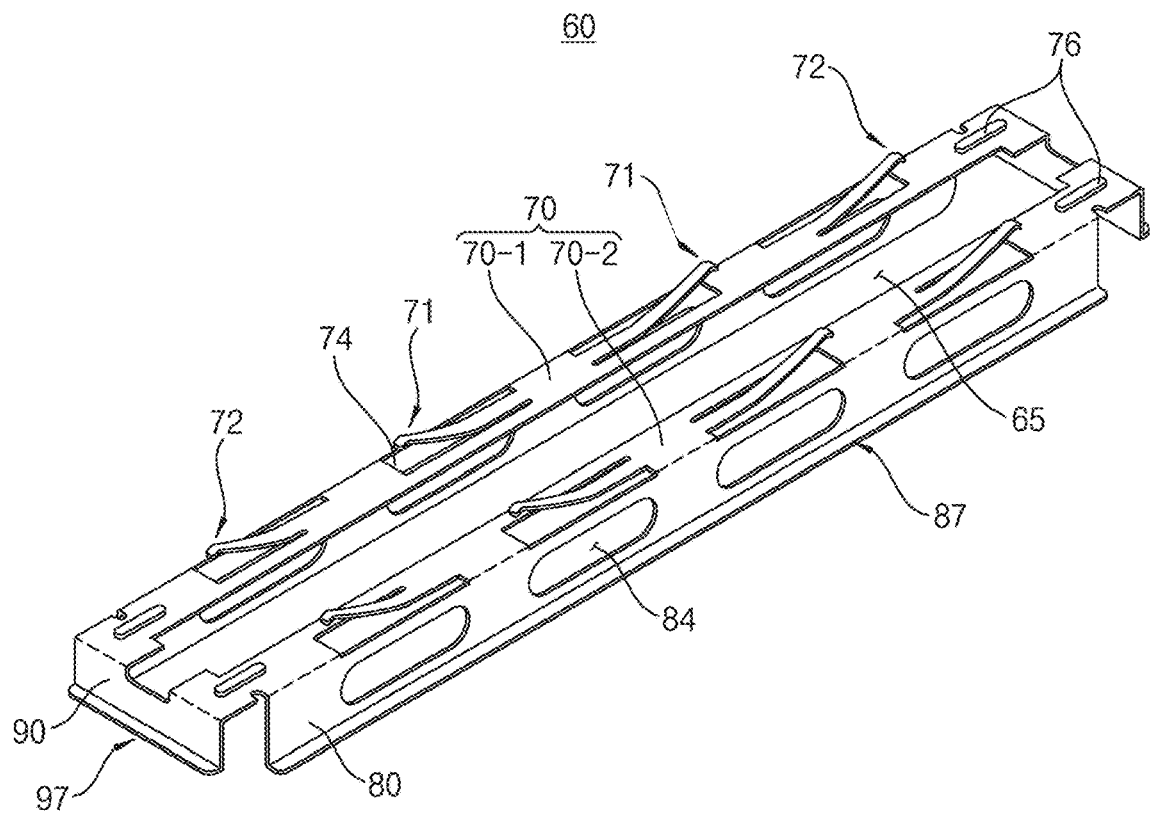
FIGS. 5A, 5B, 5C, 5D, 5E, and 5F are schematic views illustrating stiffeners according to some example embodiments of the present disclosure.
Figure 5B:
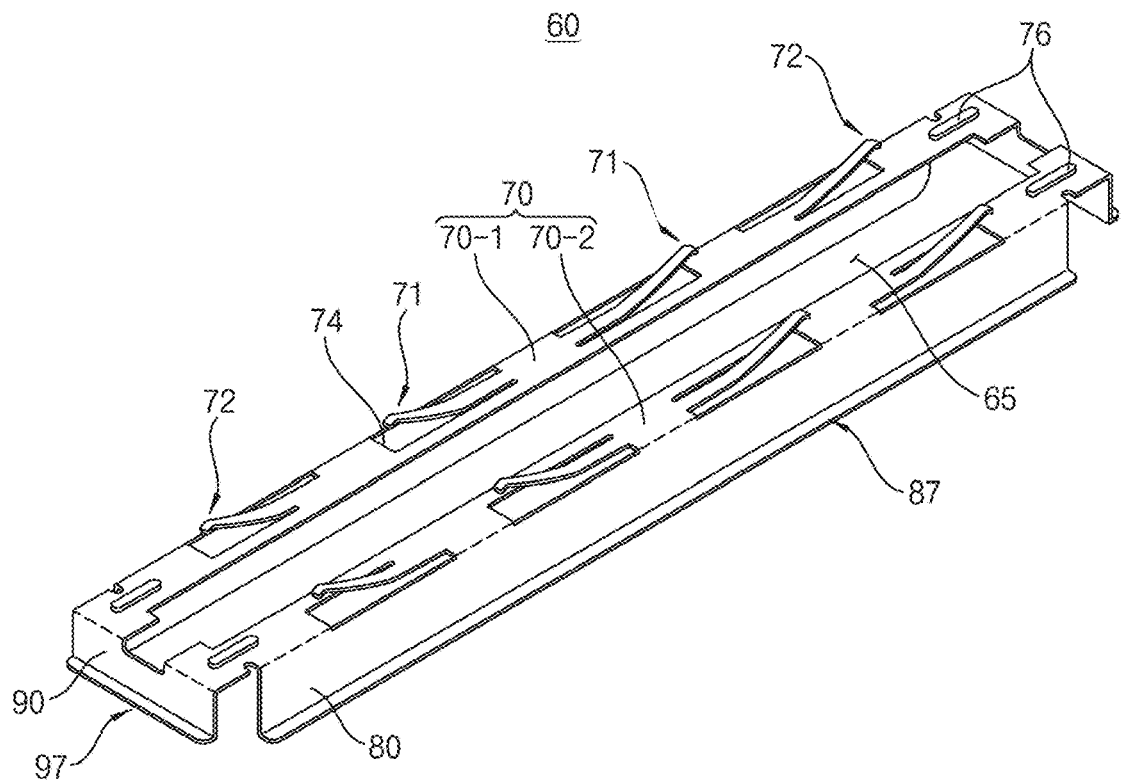
Figure 5C:
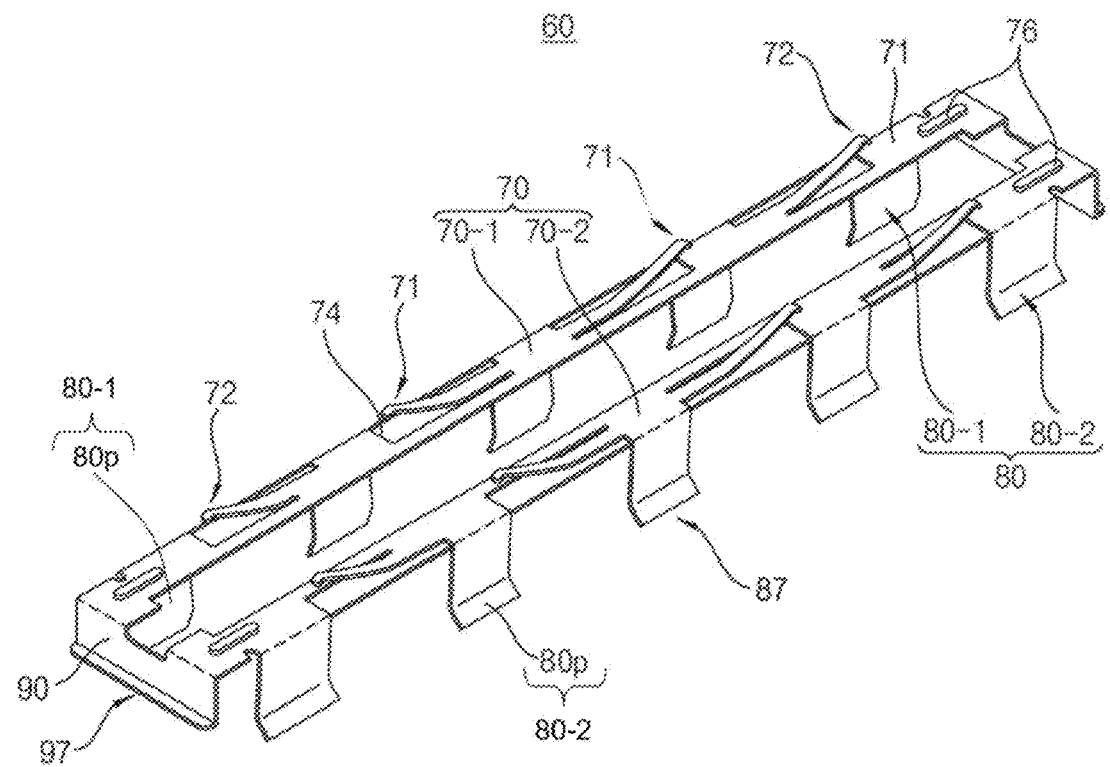
Figure 5D:
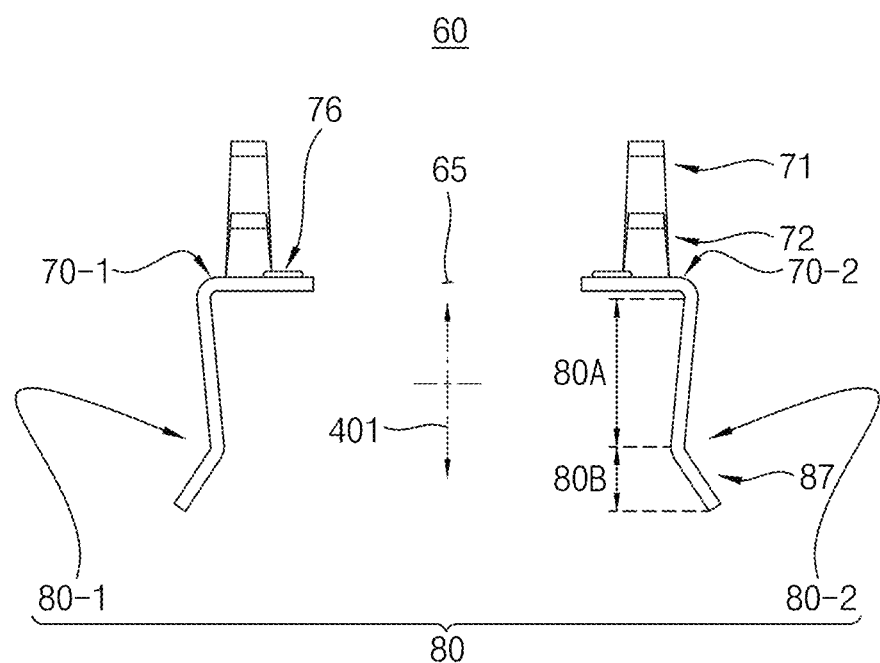
Figure 5E:
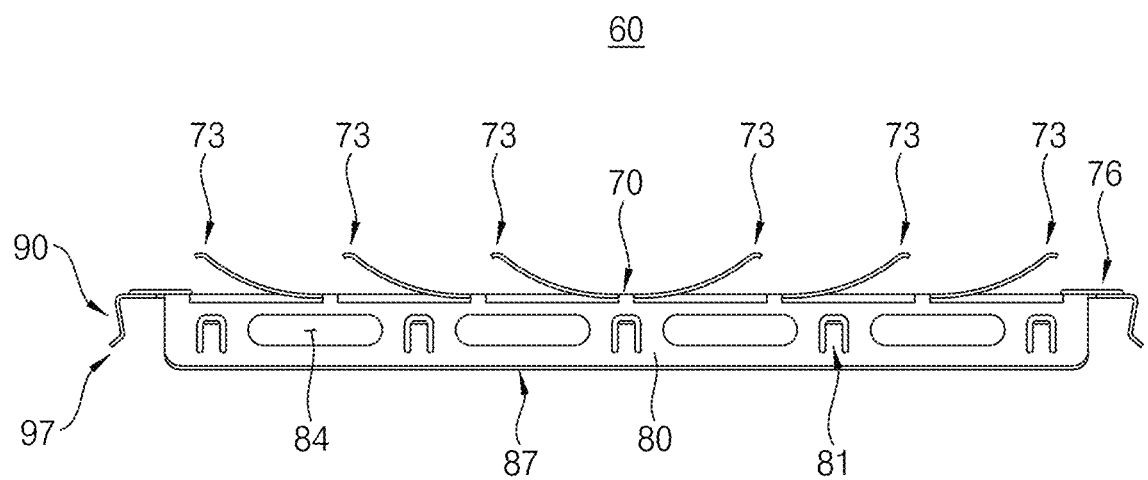
Figure 5F:
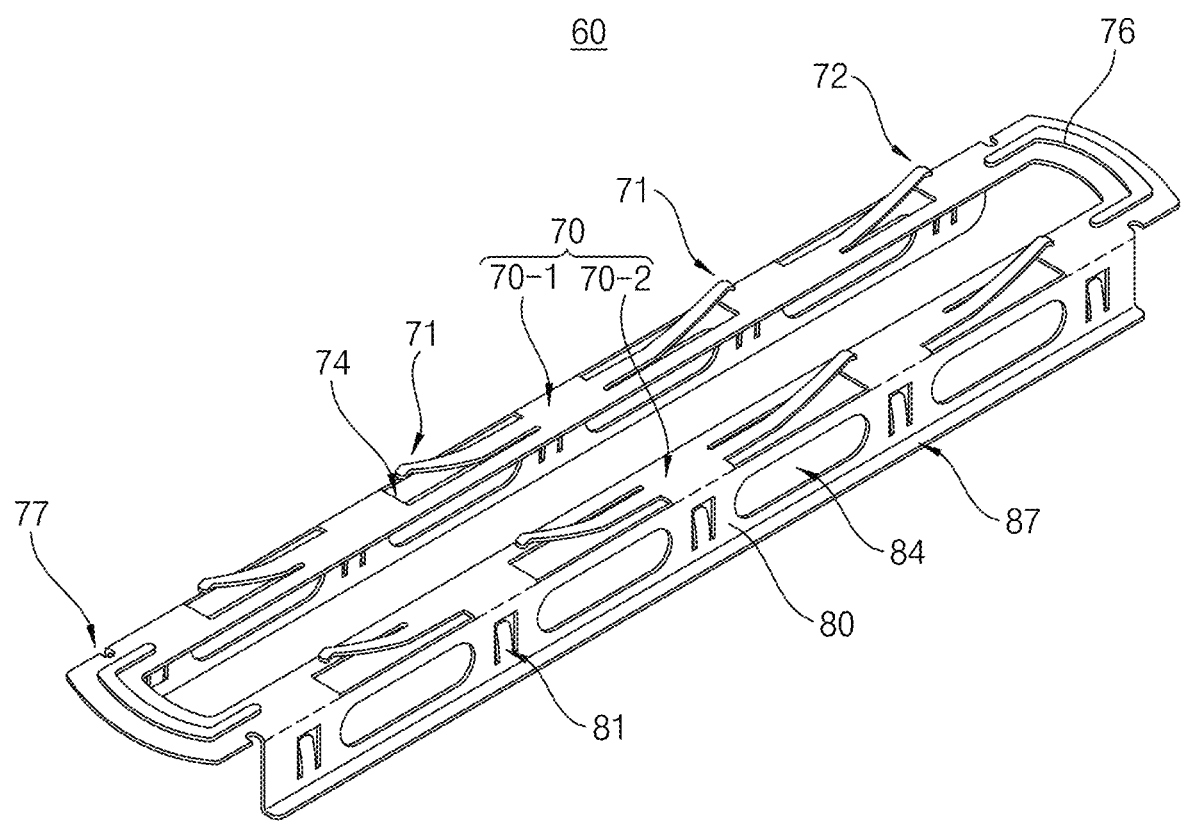

Referring to FIG. 5A, the stiffener 60 according to some example embodiments may not include lateral side elastic portions 81 in comparison with the stiffener 60 shown in FIGS. 4A to 4E. Referring to FIG. 5B, the stiffener 60 according to some example embodiments may not include the lateral side elastic portions 81 and the lateral side windows 84 formed in comparison with the stiffener 60 shown in FIGS. 4A to 4E. Referring to FIG. 5C, the stiffener 60 according to some example embodiments may include one or more lateral side covers 80-1 and 80-2 that each include a separate plurality of panels 80p that each have a leg shape in comparison with the stiffener 60 shown in FIGS. 4A to 4E. The lateral side elastic portions 81 and the lateral side windows 84 of FIGS. 4A to 4E may not be formed. Referring to FIG. 5D, the lateral side covers 80-1 and 80-2 may each have a bending shape so as to be inclined in an overhang shape, such that the lateral side covers 80-1 and 80-2 each have an upper portion 80A that is inclined towards the longitudinal axis 401 with increasing distance away from a respective upper cover 70-1 or 70-2 to which the respective lateral side cover 80-1 or 80-2 is directly connected, and a lower portion 80B, integrally connected to a bottom of the upper portion 80A, that is inclined away from the longitudinal axis 401 with increasing distance from the respective upper cover 70-1 or 70-2 to which the respective lateral side cover 80-1 or 80-2 is directly connected. Restated, the upper portion 80A may be negatively bended (e.g., reverse incline), and the lower portion 80B may be positively bended with respect to the longitudinal axis 401. Therefore, even if there are no lateral side elastic portions 81, the stiffener 60 may be appropriately engaged with the base portion of the male ZIF 55 by the elasticity of the lateral side covers 80. Referring to FIG. 5E, the stiffener 60 according to some example embodiments may include a plurality of upper elastic portions 73 having the same shape. The stiffener 60 may have a uniform vertical elasticity as a whole. Referring to FIG. 5F, the stiffener 60 according to some example embodiments may include upper covers 70, lateral side covers 80, and connection covers 77. The connection covers 77 may connect the upper covers 70 on the longitudinal ends of the upper covers 70. For example, the upper covers 70 and the connection covers 77 may be unified as one body. In some example embodiments, the longitudinal side covers 90 of FIGS. 4A to 4E may be omitted, and connection covers 77 may instead be formed. The embossing portions 76 may be formed in a U-shaped or horseshoe shape on the connection covers 77.

FIGS. 6A, 6B, 7A, and 7B schematically illustrate stiffener handling tools 400 and 500 in accordance with some example embodiments of the present disclosure.

Figure 6A:
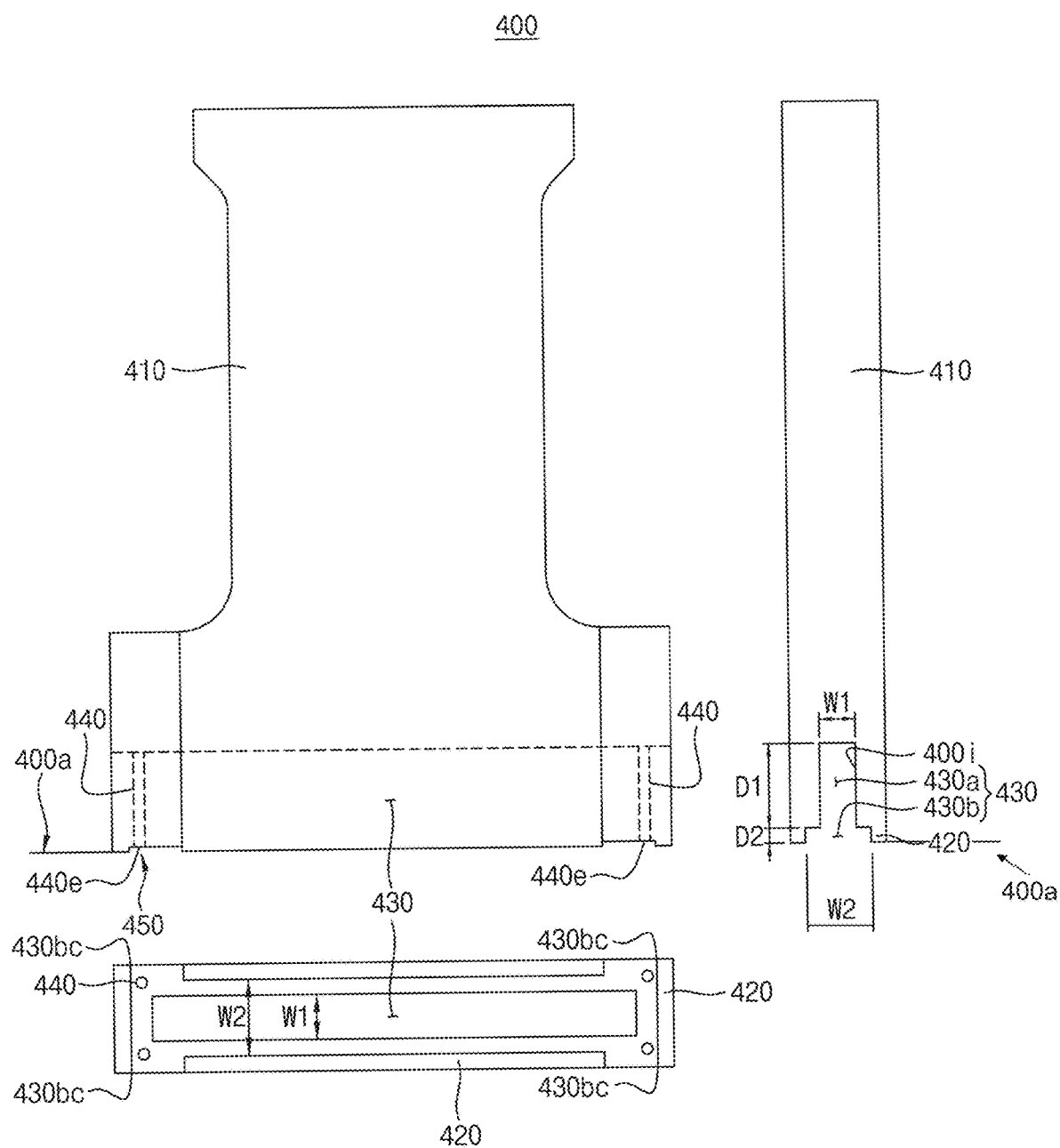
FIGS. 6A, 6B, 7A, and 7B schematically illustrate stiffener handling tools in accordance with some example embodiments of the present disclosure.
Figure 6B:
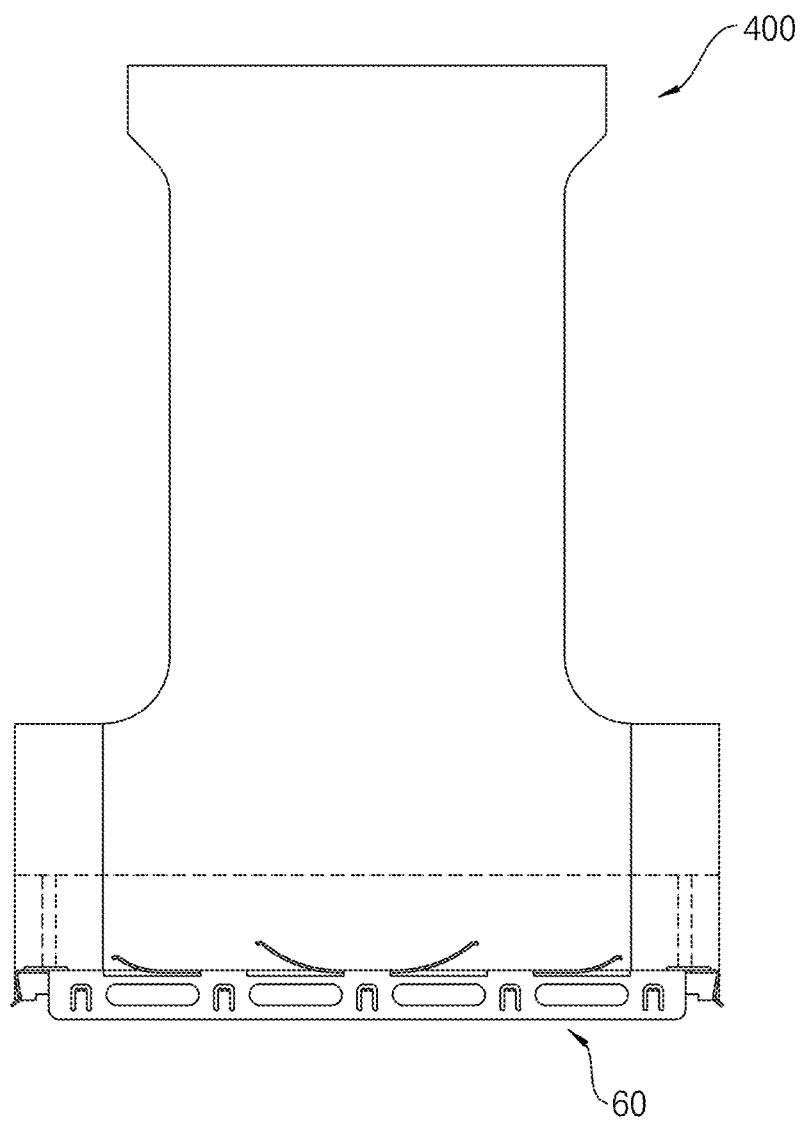

For example, FIG. 6A illustrates a front view, side view, and bottom view showing a stiffener handling tool 400 used to engage the stiffener 60 with the male ZIF 55, and FIG. 6B illustrates a stiffener handling tool 500 holding the stiffener 60.

Referring to FIG. 6A, the stiffener insert handling tool 400 according to some example embodiments of the present disclosure may include a handle portion 410 (also referred to herein as a handle structure) having a holding space 430 (also referred to herein as a holding socket) at one side, guide dams 420, and pillar-type magnets 440 (e.g., pillar shaped bar magnets, for example as shown in at least FIG. 6A). The holding space 430 may be an empty space (e.g., an open enclosure) formed inside the stiffener insert handling tool 400, such that one or more inner surfaces 400i, 400o of the handling tool 400 at least partially define the holding space 430. The holding space 430 may include an upper holding space 430a (e.g., upper holding socket) into which the connector portion 57 of the male ZIF 55 is inserted (e.g., is configured to receive the connector portion 57 of the male ZIF 55), and which is at least partially defined by one or more inner surfaces 400i of the handling tool 400, and a lower holding space 430b (e.g., lower holding socket) into which the stiffener 60 is inserted (e.g., is configured to hold the stiffener 60) and which is at least partially defined by one or more inner surfaces 400o of the handling tool 400. As shown in at least FIG. 6A, at least the guide dams 420 may at least partially define the lower holding space 430b. As further shown, the lower holding space 430b is proximate to an end 400a of the handling tool 400, and the upper holding space 430a is distal from the end 400a in relation to the lower holding space 430b. The upper holding space 430a may be formed relatively narrow and deep (high), and the lower holding space 430b may be formed relatively wide and shallow (low). Restated a depth D1 of the upper holding space 430a may be greater than a depth D2 of the lower holding space 430b, and a width W1 of the upper holding space 430a may be smaller than the width W2 of the lower holding space 430b. The magnets 440 may be embedded in the handle portion 410 such that one end 440e of each of the magnets 440 are exposed in, and at least partially defines, the lower holding space 430b, as shown in at least FIG. 6A. For example, in the bottom view, the magnets 440 may be disposed in a rectangular shape so as to close to four corners of the holding spaces 430 of the stiffener insert handling tool 400. Restated, the plurality of magnets 440 may be arranged in a rectangular (e.g., square) shape such that each separate magnet 440 of the plurality of magnets 440 is proximate to a separate corner 430bc of the lower holding space 430b. Referring to FIG. 6B, the stiffener 60 may be held in the holding space 430 by the magnets 440. The magnets 440 may each be aligned with the embossing portions 76 of the stiffener 60. The magnets 440 and the guide dams 420 may prevent the stiffener 60 from separating away from the holding space 430. At the state shown in FIG. 6B, when the male ZIF 55 and the stiffener 60 are engaged so that the connector portion 57 is inserted into the upper holding space 430a, the stiffener 60 and the base portion 56 of the male ZIF 55 may be engaged by physical resilient force of the lateral side elastic portions 81 of the stiffener 60. This resilient force may be stronger than the total magnetic force of the magnets 440. Accordingly, although the stiffener insert handling tool 400 is separated, the stiffener 60 may be stably engaged to the male ZIF 55. The male ZIF 55 is omitted in order to avoid complicated drawings.

Figure 7A:
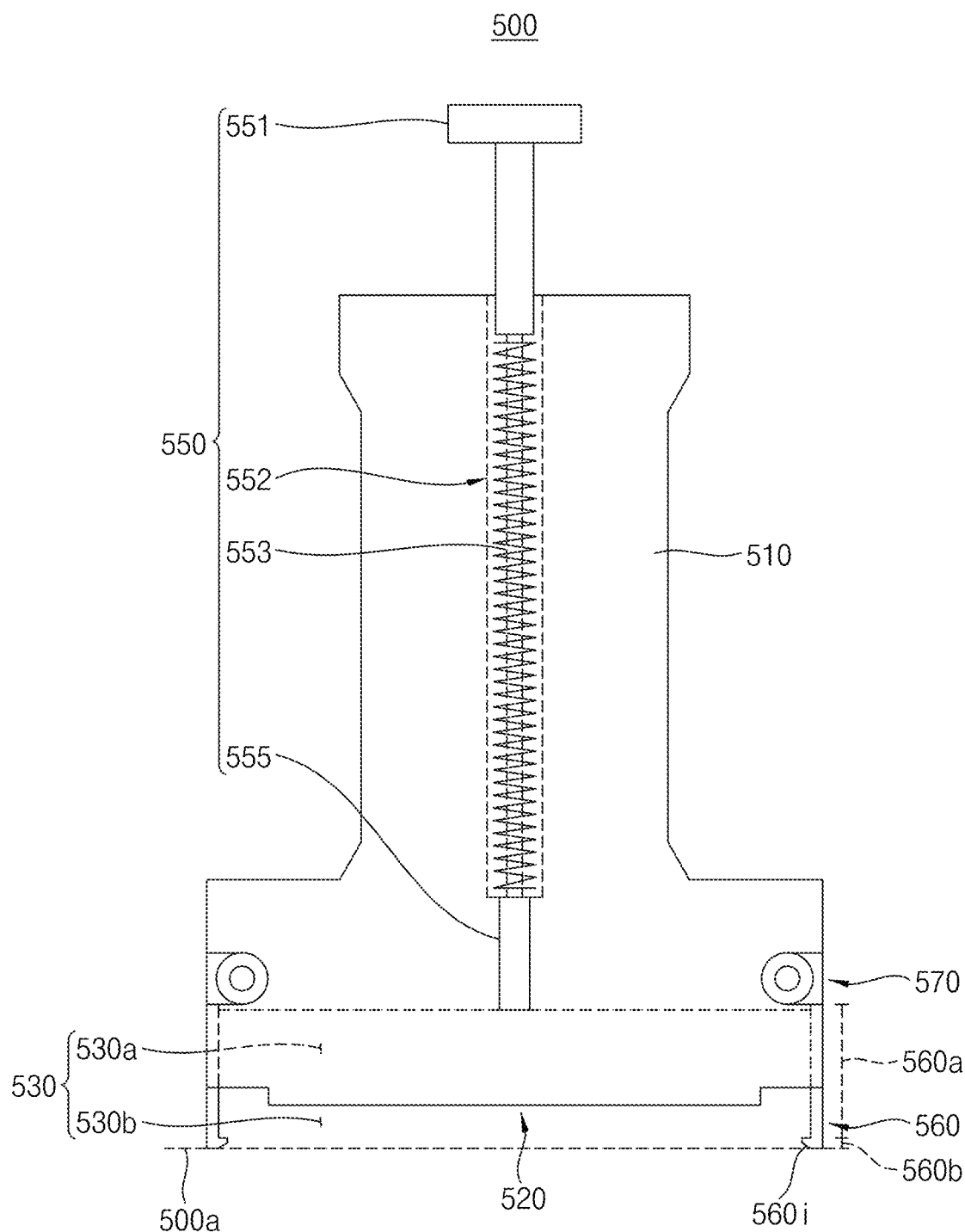
Figure 7B:
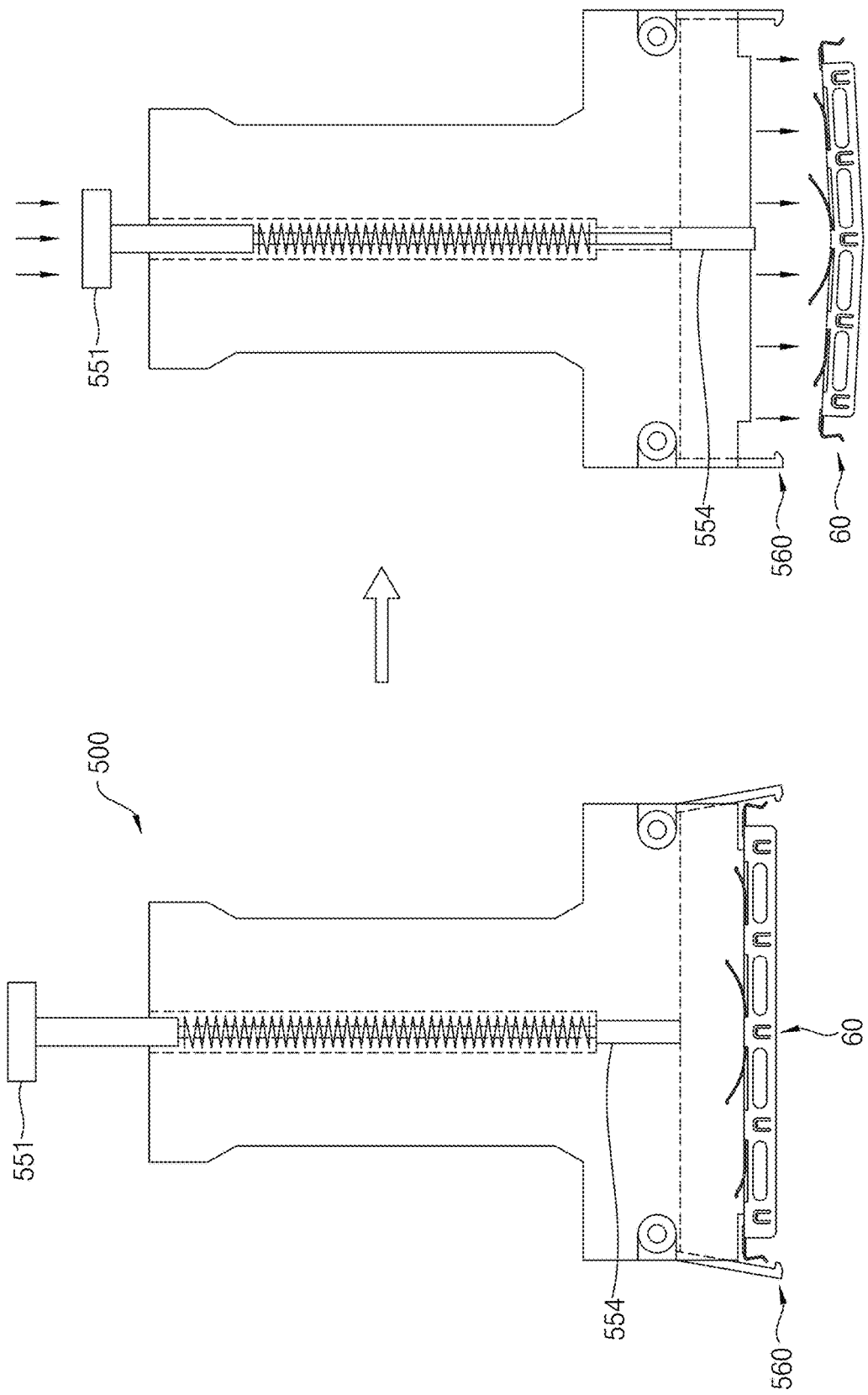

FIG. 7A shows a stiffener remove handling tool 500 used to separate the stiffeners 60 from the male ZIF 55, and FIG. 7B shows removing the a stiffener 60 from the stiffener remove handling tool 500.

Referring to FIG. 7A, the stiffener remove handling tool 500 according to some example embodiments of the present disclosure may include a handle portion 510 having (e.g., at least partially defining) a holding space 530, guide dams 520, a push unit 550 (also referred to as a push actuator), and a clamper 560 (e.g., a clamp member configured to grip another object and to hold (e.g., "clamp") the object in place). The holding space 530 may include an upper holding space 530a into which the connector portion 57 of the male ZIF 55 is inserted, and a lower holding space 530b in which the stiffener 60 is located. It will be understood that the holding space 530, the upper holding space 530a, and the lower holding space 530b may have the same properties and/or characteristics of the holding space 430, upper holding space 430a, and lower holding space 430b as described with reference to FIG. 6A, respectively. A portion of the push unit 550 may be embedded in the handle portion 510. The push unit 550 may be connected to the holding space 530 through the handle portion 510. Restated, the push unit 550 may extend (e.g., penetrate) through the handle portion 510 to the holding space 530, so as to be at least partially directly exposed to the holding space 530. The push unit 550 may include a button unit 551 (also referred to as a button), a rod 552, a spring 553, and a pusher portion 554 (also referred to as a pusher, a pusher pin, or the like). The pusher portion 554 is configured to protrude into the holding space 530. When the button unit 551 is pressed, the pusher portion 554 may protrude into the holding space 530 through the rod 552. For example, pressure of the button unit 551 may be transmitted to pusher portion 554 through the rod 552. The spring 553 may wind around the rod 552 and provide restoring force of pusher portion 554. The clampers 560 (also referred to as clamps) may be at opposite sides of the holding space 530, for example as shown in at least FIG. 7A, so as to at least partially define the holding space 530 as shown, and may clamp the longitudinal side bending portions 97 of the stiffener 60. The clampers 560 may have a ledge shape. For example, the clampers 560 may each include an upper portion 560a and a lower portion 560b, where the upper portion 560a may have a flat, panel shape and the lower portion 560b that is integrally connected to the upper portion 560a (e.g., as part of a single, uniform piece) may have a ledge shape, such that one or more lower surfaces 560i of the clampers 560, which may be included in the lower portion 560b of the clampers 560, may be inclined (e.g., inclined in relation to a direction in which the lower end 500a of the handling tool 500 extends, as shown in FIG. 7A) to allow the longitudinal side covers 90 of the stiffener 60 to slide. The clampers 560 may have a restoring resilient force by the elastic portions 570. For example, the elastic portions 570 (also referred to herein as elastic structures) may be embedded in the handle portion 510 (e.g., at least partially located within a volume space defined by one or more outer surfaces of the handle portion 510), as shown in at least FIG. 7A, and at least one elastic portion 570 may be configured to provide a restoring force to the clampers 560. For example, at least one elastic portion 570 may include a torsion spring configured to provide a restoring force to the clampers 560. In some example embodiments, the elastic portions 570 may include at least one of a compression spring, a tension spring, or a flat spring.

Referring to FIG. 7B, separating the stiffener 60 from the male ZIF 55 may include clamping the longitudinal side bending portions 97 of the stiffener 60 using the clampers 560, and removing the stiffener 60 from the stiffener remove handling tool 500 using the push unit 550. As shown in the figure, the stiffener 60 may be bent by the pressure of the push unit 550 such that the stiffener 60 may be separated from the stiffener remove handling tool 500. The male ZIF 55 is omitted in order to avoid complicated drawings.

According to some example embodiments of the present disclosure, the stiffener has an elastic portion; it is possible to elastically fix the coupling of the female ZIF of the test board and the male ZIF of the probe card, so that a gap between the female ZIF and the male ZIF can be kept constant.

According to some example embodiments of the present disclosure, a variation of the gap (or play) between the female ZIF and the male ZIF due to the bending or inclination of the probe card may be prevented and alleviated. Thus, the electrical connection between the female ZIF and the male ZIF and the electrical connection of the test head and the probe card can be protected.

In the above, some example embodiments of the present disclosure have been described with reference to the accompanying drawings, but those skilled in the art to which the present inventive concepts pertain may implement the present inventive concepts in other specific forms without changing the technical spirit or essential features thereof.

The above described example embodiments are to be understood in all respects as illustrative and not restrictive.

What is claimed is:

1. A stiffener, comprising:
    a first upper cover and a second upper cover, the first and second upper covers extending in parallel with each other;
    a first lateral side cover and a second lateral side cover, the first and second lateral side covers connected to separate, respective covers of the first and second upper covers, and facing each other; and
    a first longitudinal side cover and a second longitudinal side cover, the first and second longitudinal side covers each connected to both the first and second upper covers, the first and second longitudinal side covers facing each other,
    wherein the first and second upper covers each include a separate plurality of upper elastic portions, each upper elastic portion of each separate plurality of upper elastic portions having a vertical elasticity.

2. The stiffener of claim 1, wherein each separate plurality of upper elastic portions includes a flat spring.

3. The stiffener of claim 1, wherein each separate plurality of upper elastic portions includes a first upper elastic portion having first elastic range and a second upper elastic portion having a second elastic range, the second elastic range being smaller than the first elastic range.

4. The stiffener of claim 3, wherein
    a height from a top surface of one upper cover, of the first upper cover or the second upper cover, to an uppermost surface of the first upper elastic portion of the separate plurality of upper elastic portions of the one upper cover is a first height,
    a height from the top surface of the one upper cover to an uppermost surface of the second upper elastic portion of the separate plurality of upper elastic portions of the one upper cover is a second height, and
    the first height is greater than the second height.

5. The stiffener of claim 1, wherein each upper cover of the first and second upper covers includes a separate plurality of embossing portions protruding upwardly from an upper surface of the upper cover.

6. The stiffener of claim 5, wherein each embossing portion of the separate plurality of embossing portions has a bar shape in a top view and a mesa shape in a side view.

7. The stiffener of claim 1, wherein the first and second lateral side covers include separate, respective lateral side bending portions that are bent away from a longitudinal axis of the stiffener to have an inclined surface.

8. The stiffener of claim 1, wherein the first and second lateral side covers each include at least one lateral side window.

9. The stiffener of claim 1, wherein the first and second lateral side covers each include at least one lateral side elastic portion.

10. The stiffener of claim 1, wherein the first and second lateral side covers are each bent to be inclined in an overhang shape.

11. The stiffener of claim 1, wherein the first and second lateral side covers each include a separate plurality of panels, each panel of each plurality of panels having a leg shape.

12. The stiffener of claim 1, wherein the first and second longitudinal side covers include separate, respective longitudinal side bending portions that are bent away from a lateral axis of the stiffener to have an inclined surface.

13. The stiffener of claim 1, wherein the first and second longitudinal side covers are each bent to be inclined in an overhang shape.

14. The stiffener of claim 1, wherein
    upper portions of the first and second longitudinal side covers each include cut-out portions,
    the first and second upper covers at least partially define an insert hole between the first and second upper covers, and
    a horizontal width of each of the cut-out portions is less than a horizontal width of the insert hole.

15. The stiffener of claim 1, wherein each upper cover of the first and second upper covers includes at least one upper window.

16. The stiffener of claim 15, wherein the at least one upper window vertically overlaps one upper elastic portion of the separate plurality of upper elastic portions of the upper cover.

17. The stiffener of claim 1, wherein
    a first lateral side end of the first upper cover and the first lateral side cover are connected to each other,
    a second lateral side end of the second upper cover and the second lateral side cover are connected to each other,
    first longitudinal ends of both the first and second upper covers are connected with the first longitudinal side cover, and
    second longitudinal ends of both the first and second upper covers are connected with the second longitudinal side cover.

18. A stiffener, comprising:
    a plurality of upper covers configured to cover an upper surface of a base portion of a male Zero Insertion Force (ZIF); and
    a plurality of lateral side covers configured to cover separate, respective lateral sides of the base portion of the male ZIF,
    wherein the plurality of upper covers each include a separate plurality of upper elastic portions having a vertical elasticity.

19. The stiffener of claim 18, further comprising a plurality of longitudinal side covers configured to cover separate, respective longitudinal sides of the base portion of the male ZIF.

20. A test apparatus, comprising:
    a main tester processing circuitry;
    a wafer prober; and
    a cable electrically connecting the main tester processing circuitry and the wafer prober,
    wherein the wafer prober includes
        a test head including a test board and a female Zero Insertion Force (ZIF), and
        a test stage having a wafer chuck configured to hold a wafer and a supporter configured to structurally support a probe card,
    wherein the female ZIF of the test head and a male ZIF of the probe card are configured to be engaged to each other using a stiffener interposed therebetween,
    wherein the stiffener includes a plurality of upper elastic portions having a vertical elasticity.

* * * * *